United States Patent
Janek et al.

(10) Patent No.: US 12,103,427 B2
(45) Date of Patent: Oct. 1, 2024

(54) METHOD FOR DETERMINING THE SUPPORT OF ENERGY CONTENT AND POWER OF A BATTERY

(71) Applicant: Samsung SDI Co., Ltd., Yongin-si (KR)

(72) Inventors: Alex Janek, Graz-Liebenau (AT); Stefan Doczy, Pirka (AT)

(73) Assignee: SAMSUNG SDI CO., LTD., Yongin-si (KR)

( * ) Notice: Subject to any disclaimer, the term of this patent is extended or adjusted under 35 U.S.C. 154(b) by 1030 days.

(21) Appl. No.: 17/065,405

(22) Filed: Oct. 7, 2020

(65) Prior Publication Data
US 2021/0114481 A1    Apr. 22, 2021

(30) Foreign Application Priority Data

Oct. 17, 2019  (EP) ................................. 19203900
Sep. 23, 2020  (KR) .................... 10-2020-0123113

(51) Int. Cl.
*B60L 58/12*     (2019.01)
*G01R 31/367*    (2019.01)
(Continued)

(52) U.S. Cl.
CPC ............ *B60L 58/12* (2019.02); *G01R 31/367* (2019.01); *G01R 31/374* (2019.01);
(Continued)

(58) Field of Classification Search
None
See application file for complete search history.

(56) References Cited

U.S. PATENT DOCUMENTS 7,671,566 B2    3/2010  Du
2002/0000790 A1*  1/2002  Sano ............... G01R 31/3647
                                                   320/162
(Continued)

FOREIGN PATENT DOCUMENTS

| EP | 1 619 512 A2 | 1/2006 |
| EP | 3 534 168 A1 | 9/2019 |
| WO | WO 2018/081818 A1 | 5/2018 |

OTHER PUBLICATIONS

Partial European Search Report dated Apr. 21, 2020 for corresponding European Application No. 19203900.6, 15pp.
(Continued)

*Primary Examiner* — Justin S Lee
(74) *Attorney, Agent, or Firm* — LEWIS ROCA ROTHGERBER CHRISTIE LLP (57) ABSTRACT

In a method for determining the support of an energy content and a power of a battery for an electric vehicle, the method includes: measuring a voltage of the battery; comparing the voltage of the battery with a predetermined threshold voltage and determining whether or not the voltage is equal to or larger than the predetermined threshold voltage; determining an internal resistance of the battery; comparing the internal resistance of the battery with a predetermined threshold resistance and determining whether or not the internal resistance is equal to or less than the predetermined threshold resistance; and determining the energy content and the power of a battery of an electric vehicle is supported in response to both the voltage being equal to or larger than the predetermined threshold voltage and the internal resistance being equal to or less than the predetermined threshold resistance.

15 Claims, 2 Drawing Sheets

(51) Int. Cl.
*G01R 31/374* (2019.01)
*G01R 31/3835* (2019.01)
*G01R 31/389* (2019.01)
*B60K 6/28* (2007.10)

(52) U.S. Cl.
CPC ....... *G01R 31/3835* (2019.01); *G01R 31/389* (2019.01); *B60K 6/28* (2013.01); *B60L 2240/547* (2013.01); *B60L 2240/549* (2013.01); *B60Y 2200/91* (2013.01); *B60Y 2200/92* (2013.01)

(56) References Cited

U.S. PATENT DOCUMENTS

| | | | |
|---|---|---|---|
| 2006/0100833 A1* | 5/2006 | Plett | H01M 10/48 703/2 |
| 2006/0181245 A1* | 8/2006 | Mizuno | G01R 31/367 320/132 |
| 2008/0224709 A1 | 9/2008 | Tae et al. | |
| 2010/0247988 A1* | 9/2010 | Okumura | B60L 58/14 320/128 |
| 2011/0071781 A1* | 3/2011 | Akahane | H01M 50/209 180/65.29 |
| 2011/0156713 A1* | 6/2011 | Akamine | G01R 31/3648 324/433 |
| 2012/0256569 A1* | 10/2012 | Kawahara | H01M 10/613 374/142 |
| 2013/0090872 A1 | 4/2013 | Kurimoto | |
| 2014/0015537 A1 | 1/2014 | Uchida et al. | |
| 2014/0111164 A1 | 4/2014 | Ohkawa et al. | |
| 2016/0011269 A1* | 1/2016 | Wang | G01R 31/367 702/63 |
| 2017/0106760 A1 | 4/2017 | Wang et al. | |
| 2019/0064281 A1 | 2/2019 | Nakagawa et al. | |
| 2019/0248252 A1 | 8/2019 | Jin | |
| 2020/0290461 A1* | 9/2020 | Lu | B60L 3/12 |

OTHER PUBLICATIONS

Extended European Search Report dated Jul. 7, 2020 for corresponding European Application No. 19203900.6, 18pp.
European Office action issued in corresponding application No. EP 19 23 900.6, dated Dec. 9, 2021, 6 pages.

* cited by examiner

METHOD FOR DETERMINING THE SUPPORT OF ENERGY CONTENT AND POWER OF A BATTERY

CROSS-REFERENCE TO RELATED APPLICATION

This application claims priority to and the benefit of European Patent Application No. 19203900.6, filed in the European Patent Office on Oct. 17, 2019, and Korean Patent Application No. 10-2020-0123113, filed on Sep. 23, 2020 in the Korean Intellectual Property Office, the entire content of each of which are incorporated herein by reference.

BACKGROUND

1. Field

Aspects of some example embodiments of the present invention relate to a method for determining the support of energy content and power of a battery.

2. Description of the Related Art

In recent years, vehicles have been developed using electric power as a source of motion. An electric vehicle is an automobile that is powered by an electric motor using energy stored in rechargeable batteries. An electric vehicle may be solely powered by batteries or may be a form of hybrid vehicle powered by for example a gasoline generator. Furthermore, the vehicle may include a combination of electric motor and conventional combustion engine. In general, an electric-vehicle battery (EVB) or traction battery is a battery used to power the propulsion of battery electric vehicles (BEVs).

Electric-vehicle batteries differ from starting, lighting, and ignition batteries because they are designed to give power over sustained periods of time. A rechargeable or secondary battery differs from a primary battery in that it can be repeatedly charged and discharged, while the latter provides only an irreversible conversion of chemical to electrical energy. Low-capacity rechargeable batteries are used as power supply for small electronic devices, such as cellular phones, notebook computers and camcorders, while high-capacity rechargeable batteries are used as the power supply for hybrid vehicles and the like.

The above information disclosed in this Background section is only for enhancement of understanding of the background and therefore the information discussed in this Background section does not necessarily constitute prior art.

SUMMARY

Aspects of some example embodiments of the present invention relate to a method for determining the support of energy content and power of a battery. The invention further relates to a detection system for determining the support of energy content and power of a battery. Furthermore, the invention relates to an electric vehicle comprising such a detection system.

Aspects of some example embodiments according to the present disclosure include a method for determining the support of an energy content and a power of a battery for an electric vehicle. The method of determining the support of the energy content comprises measuring a voltage of the battery, further comparing the measured voltage with a predetermined threshold voltage and determining if the measured is equal or larger than the predetermined threshold voltage. Determining the support of the power comprises determining an internal resistance of the battery, further comparing the determined internal resistance with a predetermined threshold resistance and determining if the internal resistance is equal or less than the predetermined threshold resistance. In a further step the method comprises determining that the energy content and the power of a battery of an electric vehicle is supported, if both the measured voltage is equal or larger than the predetermined threshold voltage and the determined resistance is equal or less than the predetermined threshold resistance.

Expressed in other words, determining the support refers to availability, or in particular sufficient availability, of an energy content and a power of a battery. Sufficient energy of the battery is indicated in the present invention by the battery voltage if it is higher than a threshold voltage. Sufficient power is indicated in the present invention by the internal resistance of the battery if it is below a threshold resistance. Full support is only guaranteed, when both voltage and internal resistance fulfill the conditions. The battery voltage may be a system voltage of a stack of battery cells forming the battery, but the invention is not restricted thereto. The battery voltage to be measured may be the open-loop voltage. Internal resistance and battery voltage, i.e. the open-loop voltage, both depend on time, the internal resistance increasing under discharge and the voltage decreasing under discharge and are therefore valuable indicative quantities characterizing the state of the battery.

According to some example embodiments, in addition to the measuring and determination of the relevant quantities, mathematical operations may be utilized to determine or verify if the support is fulfilled, respectively. For example, comparators and a simple logical operator can be used for verification. Input quantities are the determined internal resistance and the measured voltage of the battery. Because these quantities can be measured or determined with ASIL B quality, the determination if power and energy is supported may then in consequence as well be verified in ASIL B quality. The comparisons with each threshold value and the consecutive logical check provide simple mathematical operations. Cumbersome cell models are circumvented by the present invention. Measurement or determination errors of the inputs can be simply accumulated to obtain a resulting error, which cannot be reached by cell models as known in the state of the art.

According to some example embodiments, the method may comprise determining that the energy content and the power of a battery of an electric vehicle is not supported, if the measured voltage is less than the predetermined threshold voltage and/or the determined resistance is larger than the predetermined threshold resistance. Also here, a simple logical operator is required to identify the lack of support. The logical operator may be an AND-logical unit and may obtain signals indicative of the support from comparator units and outputting a signal, e.g. digital signal, indicative that both the energy and the power are supported or not supported, else.

According to some example embodiments, determining the support of the energy content may comprise determining the voltage during a pause time interval in which the voltage of the battery is not controlled to be held at a constant voltage. Usually, the voltage of the battery is controlled by a control unit of the electric vehicle to yield a constant and fixed output voltage. For example such a voltage may be 48V, but the invention is not restricted thereto. A control loop may be frequently used to keep the voltage level constant despite a decay of the actual open loop voltage of the battery. Therefore, in the pause time interval, the battery voltage undergoes relaxation to the actual voltage of the battery and measurement of the actual voltage of the battery becomes feasible. The pause time interval may be periodically provided with a frequency of for example 10 minutes, but the invention is not restricted thereto. This frequency may be imposed by a control unit of an electrical vehicle.

According to some example embodiments, determining the support of the energy content may comprise determining the voltage within a pause time interval, in which a battery current is controlled to be held below a zero level threshold current. A zero level threshold voltage may be for example 100 mA or less, but the invention is not restricted thereto. When the battery current is reduced into such a small magnitude regime, the battery is less loaded, which significantly improves precision of the measurement of the battery voltage. The control of the battery current can be operated by a current control unit of the electric vehicle. According to some example embodiments, the battery current is held below the zero level threshold current throughout the whole pause time interval.

According to some example embodiments, determining the support of the energy content may comprise measuring the voltage at a measuring time being within the pause time interval, wherein the measuring time is equal to or longer than the relaxation time of the battery with respect to the start of the pause time interval. Relaxation time refers to the time scale on which the voltage battery has sufficiently decayed toward its actual voltage, or open-loop voltage. For example, the relaxation time may be 90 seconds and/or measuring time may be at 90 seconds, but the invention is note restricted thereto. The relaxation time may be less than 90 seconds, e.g. 60 seconds or 40 seconds. The relaxation time may also be larger than 90 seconds, e.g. 120 seconds or 150 seconds or even 180 seconds or more, but the invention is not restricted thereto. Thus, when measuring takes place at the relaxation time or beyond the relaxation time, the precision of the measurement of the battery voltage is further improved.

According to some example embodiments, determining the support of the power may comprise measuring a temperature of the battery and comparing the internal resistance with a temperature-dependent threshold resistance (e.g., a set or predetermined temperature-dependent threshold resistance) corresponding to the measured temperature. The inclusion of temperature-dependent threshold resistances takes beneficially into account that the internal resistance is dependent on temperature. Such an inclusion of temperature dependence allows the method to be applicable for various temperatures.

According to some example embodiments, determining the support of the power may comprise selecting the threshold resistance (e.g., the set or predetermined threshold resistance) corresponding to the measured temperature from a look-up table, the look-up table including set or predetermined threshold resistances in dependence of the temperature. A look-up table may have stored various previously determined threshold resistance values as function of temperature.

According to some example embodiments, the method may comprise determining if the temperature is higher than a minimum threshold temperature. For too low temperatures, e.g. around 3, 4 or 5° C. but the invention is not restricted thereto, the relaxation time may become very long and a measurement of the battery voltages may lack precision. Therefore, by determining that the actual temperature is higher than a minimum threshold temperature guarantees that the determined resistance or the measured voltage meets sufficient precision.

According to some example embodiments, determining the support of the power may comprise applying a test current to the battery for a set or predefined test time, and determining a voltage drop, wherein the voltage drop is the difference between the measured voltage at the start of the test time and the measured voltage at the end of the test time, further comprising calculating the internal resistance $R_{sys}$ via dividing the determined voltage drop through the applied test current: $R_{sys} = \Delta U_{sys}/I_{test}$. The test current may be a discharging current such that the battery voltage becomes less than at the beginning of the test time. But the invention is not restricted thereto and the test current may also be a charging current such that the battery voltage becomes higher than at the beginning of the test time. The test time may be as well equal or larger than a relaxation time, e.g. as described above, but the invention is not restricted thereto and the test time window may differ from the relaxation time as described above. In temporal order, the determining the support of the power may be performed after the determining of the energy level within the same pause time interval. The voltage measured at the beginning of the test time may be identical to the voltage at or after relaxation time as described above.

According to some example embodiments, a detection system for determining the support of an energy content and a power of a battery for an electric vehicle is disclosed. The detection system comprises a first determination unit to determine the support of the energy content, the first determination unit comprising a voltage measuring unit configured to measure the voltage of the battery, a first comparator unit configured to compare the measured voltage with a set or predetermined threshold voltage and determining if the measured voltage is equal or larger than the set or predetermined threshold voltage. The detection system further comprises a second determination unit to determine the support of the power, comprising a resistance determination unit configured to determine an internal resistance of the battery, a second comparator unit configured to compare the determined internal resistance with a set or predetermined threshold resistance and determining if the internal resistance is equal or less than the set or predetermined threshold resistance. The detection system further comprises a logical unit configured to determine if the energy content and the power of the battery of an electric vehicle is supported, if both the measured is equal or larger than the set or predetermined threshold voltage and the resistance is equal or less than the set or predetermined threshold resistance.

According to some example embodiments, the detection system shares the advantages as described above in the context of the described method. For the sake of clarity, some of the advantages are repeated to emphasize the benefit of the detection system according to the invention with respect to the state of the art. Beyond the measuring and determination of the quantities, simple mathematical operations, e.g. operated by comparators and logical operators, are used to determine or verify the support, respectively. Basic inputs are the determined internal resistance and the measured voltage of the battery. Since the batter voltage can be measured with ASIL B quality, the determination if power and energy is supported can in consequence as well be verified in ASIL B quality. The comparisons with each threshold value and the consecutive logical check provide simple mathematical operations. Cumbersome cell models are circumvented by the present invention. Measurement or determination errors of the inputs can be simply accumulated to obtain a resulting error.

Further characteristics of some example embodiments for the detection system can be taken from the section above regarding the corresponding method steps of the disclosed method.

According to some example embodiments, the logical unit may be configured to determine that the energy content and the power of a battery of an electric vehicle is not supported, if the measured voltage is less than the set or predetermined threshold voltage and/or the determined resistance is larger than the set or predetermined threshold resistance. The logical unit may be realized by an AND-logical unit.

According to some example embodiments, the detection system may comprise a voltage measuring unit configured to measure the voltage during a pause time interval in which the voltage of the battery is not controlled to be held at a constant voltage.

According to some example embodiments, the voltage measuring unit may be configured to measure the voltage at a measuring time being within the pause time interval, wherein the measuring time is equal to or longer than the relaxation time of the battery with respect to the start of the pause time interval.

According to some example embodiments, the voltage measuring unit may be configured to measure the voltage within a pause time interval, in which a battery current is controlled to be held below a zero level threshold current.

According to some example embodiments, the detection unit may comprise a temperature measuring unit configured to measure a temperature of the battery, wherein the second comparator unit is configured to comparing the internal resistance with a set or predetermined temperature-dependent threshold resistance corresponding to the measured temperature.

According to some example embodiments, the detection system may comprise a selecting unit configured to select the set or predetermined threshold resistance corresponding to the measured Temperature from a look-up table, the look-up table including set or predetermined threshold resistances $R_{lim}$ in dependence of the temperature.

According to some example embodiments, the detection system may comprise a temperature comparing unit configured to compare the measured temperature with a minimum threshold temperature and to determine, if the measured temperature is higher than the minimum threshold temperature.

According to some example embodiments, the detection system may comprise a current control unit configured to apply a test current to the battery for a set or predefined test time, and the voltage measurement unit may be configured to determine a voltage drop, wherein the voltage drop is the difference between the measured voltage at the start of the test time and the measured voltage at the end of the test time, and further comprising division unit calculating the internal resistance via dividing the determined voltage drop through the applied test current: $R_{sys} = \Delta U_{sys}/I_{test}$.

According to some example embodiments, an electric vehicle comprises a detection system according to one of the above mentioned embodiments.

Further aspects of embodiments according to the present invention could be learned from the dependent claims or the following description.

BRIEF DESCRIPTION OF THE DRAWINGS

Features will become apparent to those of ordinary skill in the art by describing in more detail aspects of some example embodiments with reference to the attached drawings in which.

DETAILED DESCRIPTION

Reference will now be made in detail to embodiments, examples of which are illustrated in the accompanying drawings. Effects and features of the example embodiments, and implementation methods thereof will be described with reference to the accompanying drawings. In the drawings, like reference numerals denote like elements, and redundant descriptions are omitted. As used herein, the term "and/or" includes any and all combinations of one or more of the associated listed items. Further, the use of "may" when describing embodiments of the present invention refers to "one or more embodiments of the present invention."

It will be understood that although the terms "first" and "second" are used to describe various elements, these elements should not be limited by these terms. These terms are only used to distinguish one element from another element. For example, a first element may be named a second element and, similarly, a second element may be named a first element, without departing from the scope of the present invention.

In the following description of embodiments of the present invention, the terms of a singular form may include plural forms unless the context clearly indicates otherwise.

It will be further understood that the terms "include," "comprise," "including," or "comprising" specify a property, a region, a fixed number, a step, a process, an element, a component, and a combination thereof but do not exclude other properties, regions, fixed numbers, steps, processes, elements, components, and combinations thereof.

The electronic or electric devices, e.g. the detection system, and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices, e.g. of the detection system, may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the example embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Rechargeable batteries may be used as a battery module formed of a plurality of unit battery cells coupled in series and/or in parallel so as to provide a high energy density, for example, for motor driving of a hybrid vehicle. A battery module may be formed by interconnecting the electrode terminals of the plurality of unit battery cells depending on a required amount of power and in order to realize a high-power rechargeable battery. The cells can be connected in series, parallel or in a mixture of both to deliver the desired voltage, capacity, or power density. Components of battery packs include the individual battery modules and the interconnects, which provide electrical conductivity between them.

For meeting the dynamic power demands of various electrical consumers connected to the battery system a static control of battery power output and charging may not be sufficient. Thus, there may be a steady exchange of information between the battery system and the controllers of the electrical consumers. This information includes the battery systems actual state of charge (SoC), potential electrical performance, charging ability and internal resistance as well as actual or predicted power demands or surpluses of the consumers.

Battery systems may include a battery control unit, referred to as battery management unit (BMU) and/or battery management system (BMS), for processing the aforementioned information. The battery control unit may comprise controllers of the various electrical consumers and contain suitable internal communication busses, e.g. a SPI or CAN interface. The battery control unit may further communicate with each of the battery submodules, for example, with a cell supervision circuit (CSC) of each battery submodule. The CSC may be further connected to a cell connection and sensing unit (CCU) of a battery submodule that interconnects the battery cells of the battery submodule. Thus, the battery control unit may be provided for managing the battery pack, such as by protecting the battery from operating outside its safe operating area, monitoring its state, calculating secondary data, reporting that data, controlling its environment, authenticating it and/or balancing it. In some instances, the battery control unit may control a relay to a load and may switch the load in various fault situations.

Safety relevant cell modeling is required due to numerous driving assistance systems for electric vehicles, e.g. battery electric vehicles or plugin hybrid electric vehicles (PHEV). Integration of the driving systems into vehicles supports the vehicle driver and increases driving safety but transfers more and more responsibilities of driving from the driver to the automated assistance systems. The function of such automated assistance systems may enable a defined energy level together with a certain power level for a defined time frame. Cell modeling calculations may not meet safety standards as for example ASIL B (automotive safety integrity level B) requirements.

Generating results in safety standards according to ASIL B quality has high demands on plausibility and redundancy of all inputs required. This concerns measurement inputs but even also models and modelling data which deliver parts forming the overall result.

As cell models are very complex models approximating cell response based on measured, fitted and interpolated data, may be difficult or even impossible to use them to generate ASIL B quality results.

Accordingly, some example embodiments of the present invention may provide a method and a detection system for determining the support of an energy content and a power of a battery providing with high reliability which is operable to meet ASIL B requirements.

Figure 1:
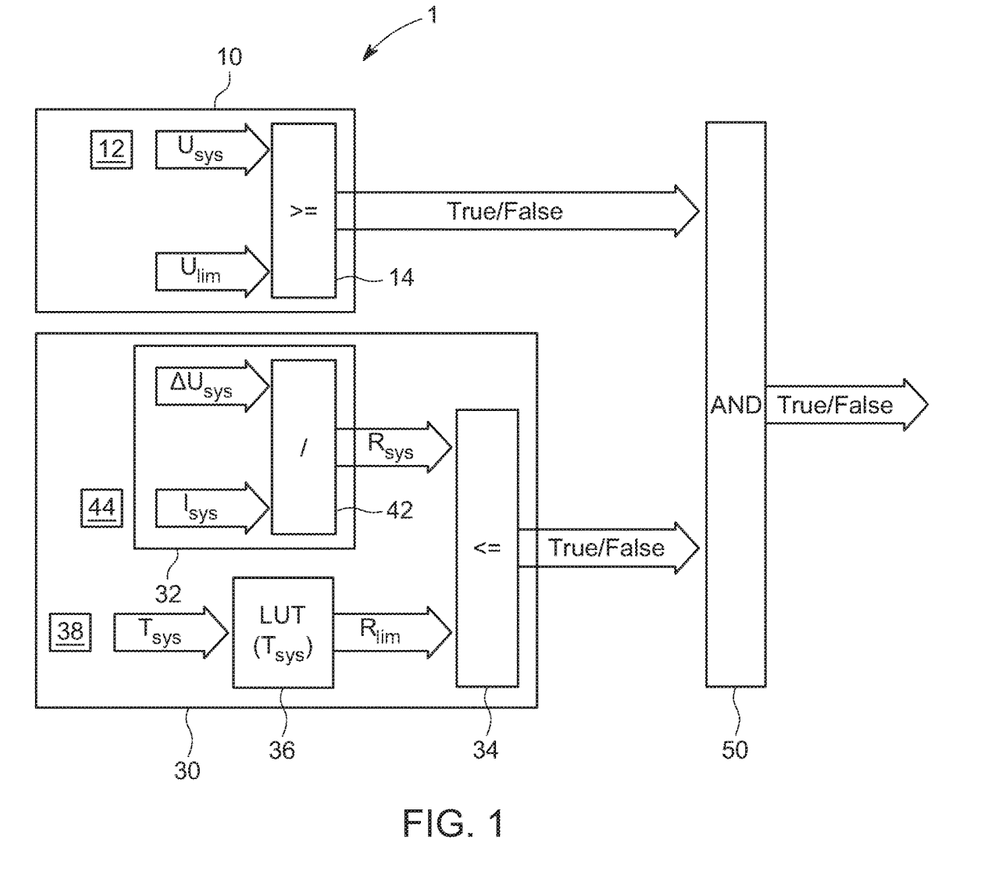
FIG. 1 illustrates a method and a detection system for determining the support of an energy content and a power of a battery for an electric vehicle according to some example embodiments of the invention.
Figure 2:
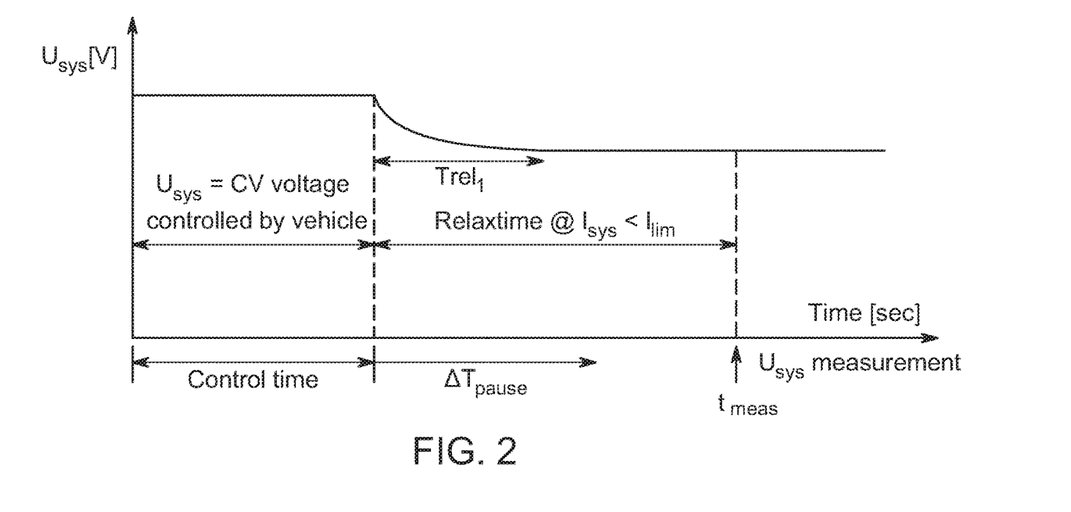
FIG. 2 illustrates a method of determining the support of the energy content according to some example embodiments of the invention.
Figure 3:
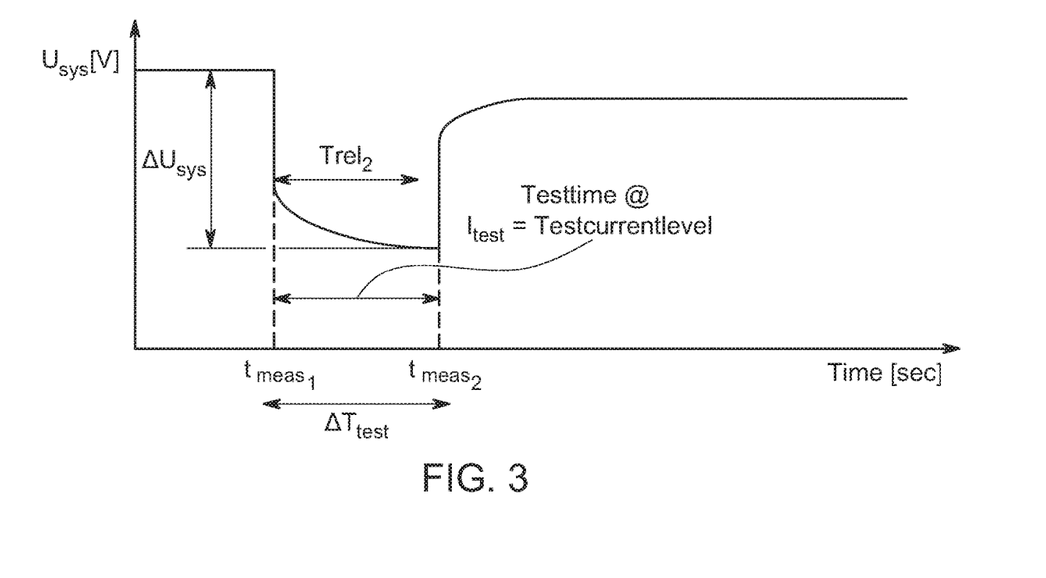
FIG. 3 illustrates a method of determining the support of the power according to some example embodiments of the invention.

FIG. 1 shows a method and a detection system 1 for determining the support of an energy content and a power of a battery for an electric vehicle according to some example embodiments of the invention. Reference will be made in the following to FIGS. 2 and 3, which provide detailed illustrations of some example embodiments of the method. For example, FIG. 2 shows the method of determining the support of the energy content according to some example embodiments of the invention and FIG. 3 shows the method of determining the support of the power according to some example embodiments of the invention.

The method for determining the support of an energy content and a power of a battery for an electric vehicle will be described in the following together with the detection system 1 as shown in the example shown in FIG. 1.

The method for determining the support of an energy content and a power of a battery for an electric vehicle comprises the determining of the support of the energy content. The detection system 1 therefore comprises a first determination unit 10 which is configured to determine the support of the energy content according to some example embodiments.

According to some example embodiments, the method comprises measuring a voltage $U_{sys}$ of the battery. The voltage $U_{sys}$ may refer to the stack voltage of a battery comprising a stack of battery cells. The detection system 1 therefore comprises a voltage measuring unit 12. The method further comprises comparing the measured battery voltage $U_{sys}$ with a set or predetermined threshold voltage $U_{lim}$ and determining if the measured voltage $U_{sys}$ is equal or larger than the set or predetermined threshold voltage $U_{lim}$. Therefore, the first determination unit 10 comprises a first comparator unit 14. The first comparator unit 14 may receive for example an analog input signal from the voltage measuring unit 12 indicative of the measured voltage $U_{sys}$, may then for example compare the received value with a set or predetermined threshold voltage $U_{lim}$ and may output for example a digital signal indicative of if the measured voltage $U_{sys}$ is equal or larger than the set or predetermined threshold voltage $U_{lim}$.

The method for determining the support of an energy content and a power of a battery for an electric vehicle further comprises the determining of the support of the power. The detection system 1 therefore comprises a second determination unit 30.

The method comprises determining an internal resistance $R_{sys}$ of the battery. The second determination unit 30 may therefore comprise a resistance determination unit 32 which is configured to determine the internal resistance $R_{sys}$.

Then, the method comprises comparing the determined internal resistance $R_{sys}$ with a set or predetermined threshold resistance $R_{lim}$ and determines if the determined internal resistance $R_{sys}$ is equal or less than the set or predetermined threshold resistance $R_{lim}$. Therefore, the second determination unit 30 comprises a second comparator unit 34. The second comparator unit 34 may receive for example an analog input signal from the resistance determination unit 32 indicative of the determined internal resistance $R_{sys}$, may then compare the received value with the set or predetermined threshold resistance $R_{lim}$ and may output for example a digital signal indicative of if the determined internal resistance $R_{sys}$ is equal or less than the set or predetermined threshold resistance $R_{lim}$.

In a further step, the method may comprise determining that the energy content and the power of a battery of an electric vehicle is supported, if both the measured voltage $U_{sys}$ is equal or larger than the set or predetermined threshold voltage $U_{lim}$ and the determined resistance $R_{sys}$ is equal or less than the set or predetermined threshold resistance $R_{lim}$. The detection system 1 therefore may comprise a logical unit 50 configured to output a digital signal indicative of that both conditions as described above are fulfilled.

The method and detection system 1 has the advantage that beyond the measuring and determination of the quantities, simple mathematical operations are used to determine the support, respectively. Input quantities can be measured with ASIL B quality, and, in consequence, as well be verified in ASIL B requirements, since the comparisons with each threshold value and the consecutive logical check provide simple mathematical operations which allow furthermore straightforward estimation of error, which cannot be achieved with cell models.

In a further step the method may comprise determining that the energy content and the power of a battery of an electric vehicle is not supported, if the measured voltage $U_{sys}$ is less than the set or predetermined threshold voltage $U_{lim}$ and/or the determined resistance $R_{sys}$ is larger than the set or predetermined threshold resistance $R_{lim}$. Therefore, the logical unit 50 of the detection system 1 may be an AND-logical unit. In general, the input signals received by the logical unit 50 may not be synchronically received but in sequential temporal order as described below. Therefore, the logical unit 50 may have an internal storage to store a received input signal until the other input signal is received. Then, after this time delay, the logical unit 50 may be configured to determine if energy content and the power of a battery of an electric vehicle are supported or not as described above.

Regarding the method of determining the support of the energy content in detail, the method may, according to some example embodiments, comprise measuring the battery voltage $U_{sys}$ during a pause time interval $\Delta T_{pause}$ in which the battery voltage $U_{sys}$ of the battery is not controlled to be held at a constant voltage, see for example FIG. 2 of the present invention.

Usually, the battery voltage $U_{sys}$ may be controlled by a control loop, e.g. of the electric vehicle, to be held at a particular level to yield a constant output of a fixed voltage. Nevertheless, the actual battery voltage or the actual open loop voltage of the battery might decay. For example, a battery voltage may be 48V and the open loop voltage might decay to 42V or 43V, but the invention is not restricted thereto. Therefore, in the pause time interval $\Delta T_{pause}$, as can be seen for example in FIG. 2, the battery voltage $U_{sys}$ undergoes relaxation to the actual voltage of the battery and measurement. Thus, actual voltage of the battery can be measured. The pause time interval $\Delta T_{pause}$ may be periodically provided with a frequency of for example 10 minutes, but the invention is not restricted thereto. This frequency may be imposed by a control unit of the electrical vehicle. In FIG. 2, the constant voltage regime refers to the initial part referred to as control time on the time axis. During a pause time interval $\Delta T_{pause}$, the voltage $U_{sys}$ then undergoes relaxation toward an open loop voltage. As can be seen in FIG. 2, the measuring point $t_{meas}$ is within the pause time interval $\Delta T_{pause}$, where the battery voltage has relaxated and/or even saturated.

Further, according to some example embodiments as it is also shown in FIG. 2, the method may include to measure the battery voltage $U_{sys}$ within the pause time interval $\Delta T_{pause}$, in which a battery current $I_{sys}$ is controlled to be held below a zero level threshold current him. Then the battery load is reduced and the precision of the measurement of the voltage $U_{sys}$ improved. The current control may be operated by a current control unit 44 of the electric vehicle. A zero level threshold voltage may be for example 100 mA or less, but the invention is not restricted thereto. As can be seen in FIG. 2, according to some example embodiments, the battery current $I_{sys}$ is held below the zero level threshold current him throughout the whole pause time interval $\Delta T_{pause}$ to improve the precision of measurement.

According to some example embodiments, as can be seen as well in FIG. 2, the determining of the support of the energy content may comprise measuring the battery voltage $U_{sys}$ at a measuring time $t_{meas}$ being within the pause time interval $\Delta T_{pause}$, wherein the measuring time $t_{meas}$ is equal to or longer than the relaxation time $T_{rel1}$ of the battery with respect to the start of the pause time interval $\Delta T_{pause}$. Then, the battery voltage $U_{sys}$ has sufficiently saturated and the precision of the measurement is improved. In the example embodiment of FIG. 2, the measuring time $t_{meas}$ is longer than the relaxation time $T_{rel1}$, but the invention is not restricted thereto and in other embodiments the measuring time $t_{meas}$ and the relaxation time $T_{rel1}$ may coincide with each other. For example, the relaxation time may be 90 seconds or but the invention is note restricted thereto. The relaxation time may be 130 seconds or 170 seconds or even 200 seconds or more. The voltage measuring unit 12 may be configured to measure the battery voltage according to the above described embodiments.

Regarding the method of determining the support of the energy content in detail, the method may, according to some example embodiments, as shown in FIG. 1, comprise measuring a temperature $T_{sys}$ of the battery or its close environment and compare the internal resistance $R_{sys}$ with a set or predetermined temperature-dependent threshold resistance $R_{lim}$ that refers to the measured temperature $T_{sys}$. The detection system 1 may therefore comprise a temperature measuring unit 38. The threshold resistance $R_{lim}$ may thus be temperature-dependent and therefore method and detection system can operate in various temperature conditions. The second comparator unit 34 may then be configured to receive the threshold resistance $R_{lim}$ that corresponds to the measured temperature.

According to some example embodiments, as can be seen in FIG. 1, determining the support of the power may comprise selecting the set or predetermined threshold resistance $R_{lim}$ corresponding to the measured temperature $T_{sys}$ from a look-up table 36. The look-up table 36 may thereby include set or predetermined threshold resistances $R_{lim}$ in dependence of stored temperature values.

According to some example embodiments of the invention, the method may comprise determining if the measured temperature $T_{sys}$ is higher than a minimum threshold temperature. The detection system 1 may therefore comprise, beside a temperature measuring unit 38, a temperature comparator unit, which is configured to determine, whether or not the temperature $T_{sys}$ is higher than a minimum threshold temperature. Only if this condition is fulfilled, the method and the detection system as described above and below, may be operated. For example, for too low temperatures, e.g. around 3, 4 or 5° C. but embodiments according to the present invention are not restricted thereto, the relaxation time may become very long and measurements may thus lack precision. Therefore, by determining that the actual temperature is higher than a threshold guarantees that the determined resistance or the measured voltage has sufficient precision.

According to some example embodiments of the present invention, the method of determining the support of the power comprises may comprise applying a test current $I_{test}$ to the battery for a set or predefined test time $\Delta T_{test}$, as can be seen in FIG. 3 of the present invention. Therefore, a current control unit 44 may be included (see schematically in FIG. 1). Here, in FIG. 3, merely as an example, the test current $I_{test}$ refers to a discharging current which leads to a negative voltage drop as function of time, but the invention is not restricted thereto and the invention may also be performed with a charging current $I_{test}$, see also description below.

The method further may comprise measuring a voltage drop $\Delta U_{sys}$ by the voltage measuring unit 12, wherein the voltage drop $\Delta U_{sys}$ is the difference between the measured voltage at the start, first measuring time $t_{meas1}$, of the test time $\Delta T_{test}$ and the measured voltage at the end, second measuring time $t_{meas2}$, of the test time $\Delta T_{test}$. Both, the voltage drop $\Delta U_{sys}$ and the test current $I_{test}$ are consecutively supplied as inputs to a divisor unit 42 of the resistance determination unit 32, see FIG. 1.

The method may then further comprise calculating the internal resistance $R_{sys}$ via dividing the measured voltage drop $\Delta U_{sys}$ through the applied test current $I_{test}$, which leads to the internal resistance $R_{sys} = \Delta U_{sys}/I_{test}$. The divisor unit 42 which is configured to perform the above division may then supply a signal indicative of the determined internal resistance $R_{sys}$ as input to the second comparator unit 34 as described above. The divisor unit 42 may also account for the signum by taking the modulus $\Delta U_{sys} = |U_{sys}(t_{meas1}) - U_{sys}(t_{meas2})|$ to calculate a positive defined resistance, when discharging or charging test current $I_{test}$ is used. The test time $\Delta T_{test}$ may be as well equal or larger than a relaxation time $T_{rel2}$, e.g. as described above, but the invention is not restricted thereto and the test time $\Delta T_{test}$ may be different than the relaxation time, for example, higher. In temporal order, determining the support of the power may be performed after the determining of the energy level, the latter shown in FIG. 2, within the same pause time interval $\Delta T_{pause}$. The voltage measured at the start $t_{meas1}$ of the test time may in consequence be the same as the voltage $U_{sys}$ at or after relaxation time $T_{rel1}$ or at measuring time $t_{meas}$ as viewed in FIG. 2.

In summary, the disclosed method and the detection system 1 have the characteristic that relatively simple mathematical operations are used to determine or verify if a support of energy and power is fulfilled, respectively. For example, comparators and simple logical operators can be used for verification. All required input quantities, e.g. temperature, voltage or cell voltage, current, time, pre measurement of the threshold resistances, can be done according to ASIL B standards, such that in consequence the verification of the support of energy and power may as well be generated meeting ASIL B quality with the underlying principle.

The positioning of the measuring elements temperature measuring unit 38, current control unit 44, voltage measuring unit 12 and temperature comparison unit corresponding to the first and second determination unit 10, 30, respectively, as shown in FIG. 1 is only an example but the invention is not restricted thereto. The positioning can be reversed and interchanged and the measuring units may even be external. The positioning in FIG. 1 is only schematically as the person skilled in the art would readily identify.

In a further aspect of the invention, according to some example embodiments, an electrical vehicle is disclosed, which comprises a detection system 1 as described in the various embodiments above.

It should be understood that the example embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

LISTING OF SOME REFERENCE NUMERALS AND SYMBOLS 1 detection system
10 first determination unit
12 voltage measuring unit
14 first comparator unit
30 second determination unit
32 resistance determination unit
34 second comparator unit
36 look-up table
38 temperature measuring unit
42 divisor unit
44 current control unit
50 logical unit
$U_{sys}$ battery voltage
$U_{lim}$ threshold voltage
$\Delta U_{sys}$ voltage drop
$I_{sys}$ battery current
$I_{lim}$ zero level threshold current
$I_{test}$ test current
$T_{sys}$ temperature
$\Delta T_{pause}$ pause time interval
$t_{meas}$ measuring time
$T_{rel1}$ relaxation time
$R_{sys}$ internal resistance
$R_{lim}$ threshold resistance
$\Delta T_{test}$ test time
$t_{meas1}$ first measuring time
$t_{meas2}$ second measuring time
$T_{rel2}$ relaxation time

What is claimed is:

1. A method for determining the support of an energy content and a power of a battery for an electric vehicle, the method comprising:

measuring a voltage of the battery at a measuring point within a time interval in which constant voltage control of the battery is stopped and a battery current is controlled to be held below a threshold current and greater than zero;

comparing the voltage of the battery with a predetermined threshold voltage and determining whether or not the voltage is equal to or larger than the predetermined threshold voltage;

determining an internal resistance of the battery;

comparing the internal resistance of the battery with a predetermined threshold resistance and determining whether or not the internal resistance is equal to or less than the predetermined threshold resistance; and determining the energy content and the power of a battery of an electric vehicle is supported in response to both the voltage being equal to or larger than the predetermined threshold voltage and the internal resistance being equal to or less than the predetermined threshold resistance, wherein the measuring point is a time point at which a time equal to or longer than a relaxation time of the battery has elapsed with respect to the start of the time interval.

2. The method of claim 1, further comprising determining the energy content and the power of a battery of an electric vehicle is not supported based on the measured voltage being less than the predetermined threshold voltage and/or the internal resistance being larger than the predetermined threshold resistance.

3. The method of claim 1, wherein determining the support of the energy content comprises determining the voltage during a pause time interval in which the voltage of the battery is not controlled to be held at a constant voltage.

4. The method of claim 1, wherein determining the support of the energy content comprises determining the voltage within a pause time interval, in which a battery current is controlled to be held below a zero level threshold current.

5. The method of claim 3, wherein determining the support of the energy content comprises measuring the voltage at a measuring time being within the pause time interval, wherein the measuring time is equal to or longer than a relaxation time of the battery with respect to the start of the pause time interval.

6. The method of claim 1, wherein determining the support of the power comprises measuring a temperature of the battery and comparing the internal resistance with a predetermined temperature-dependent threshold resistance corresponding to the measured temperature.

7. The method of claim 6, wherein determining the support of the power comprises selecting the predetermined threshold resistance corresponding to the measured temperature from a look-up table, the look-up table including predetermined threshold resistances in dependence of the temperature.

8. The method of claim 6, comprising determining if the temperature is higher than a minimum threshold temperature.

9. The method of claim 1, wherein determining the support of the power comprises applying a test current to the battery for a predefined test time, and determining a voltage drop, wherein the voltage drop is a difference between the measured voltage at the start of the test time and the measured voltage at the end of the test time, further comprising calculating the internal resistance via dividing the determined voltage drop through the applied test current.

10. A detection system for determining the support of an energy content and a power of a battery for an electric vehicle, comprising:

a processor and memory, the memory storing instructions executable by the processor to:

determine the support of the energy content by measuring a voltage of the battery at a measuring point within a time interval in which constant voltage control of the battery is stopped and a battery current is controlled to be held below a threshold current and greater than zero and comparing the measured voltage with a predetermined threshold voltage and determining if the measured voltage is equal or larger than the predetermined threshold voltage;

determine the support of the power by determining an internal resistance of the battery and comparing the determined internal resistance with a predetermined threshold resistance and determining if the internal resistance is equal or less than the predetermined threshold resistance; and determine if the energy content and the power of the battery of an electric vehicle is supported, if both the measured is equal or larger than the predetermined threshold voltage and the resistance is equal or less than the predetermined threshold resistance, wherein the measuring point is a time point at which a time equal to or longer than a relaxation time of the battery has elapsed with respect to the start of the time interval.

11. The detection system of claim 10, wherein the energy content and the power of a battery of an electric vehicle is not supported when the measured voltage is less than the predetermined threshold voltage and/or the internal resistance is larger than the predetermined threshold resistance.

12. The detection system of claim 10, wherein the voltage is measured during a pause time interval in which the voltage of the battery is not controlled to be held at a constant voltage.

13. The detection system of claim 10, wherein the voltage is measured at a measuring time being within a pause time interval, and wherein the measuring time is equal to or longer than a relaxation time of the battery with respect to the start of the pause time interval.

14. The detection system of claim 10, wherein the voltage is measured within a pause time interval, in which a battery current is controlled to be held below a zero level threshold current.

15. An electric vehicle comprising the detection system according to claim 10.

* * * * *